Figure 1:
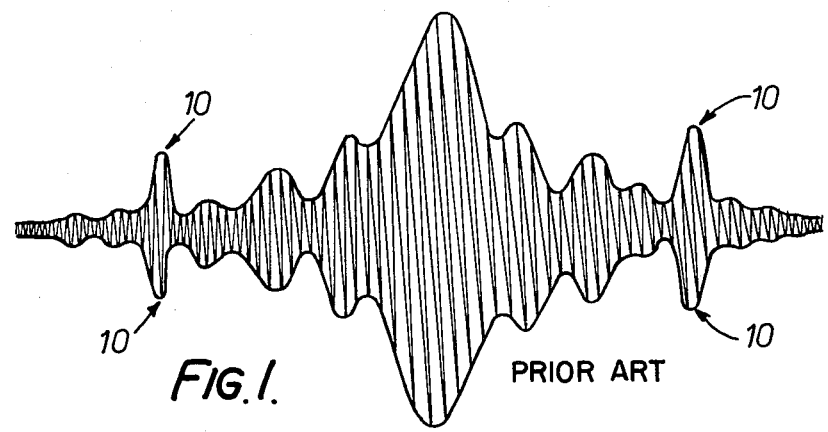

United States Patent [19]

Lewis et al.

[11] 4,144,508

[45] Mar. 13, 1979

[54] SURFACE ACOUSTIC WAVE FILTERS

[75] Inventors: Brian Lewis, Brackley; John M. Deacon, Northampton, both of England

[73] Assignee: Plessey Handel und Investments AG, Zug, Switzerland

[21] Appl. No.: 820,625

[22] Filed: Jul. 28, 1977

[30] Foreign Application Priority Data

Jul. 29, 1976 [GB] United Kingdom ............... 31542/76

[51] Int. Cl.$^2$ ..................... H03H 9/04; H03H 9/26; H03H 9/32; H01L 41/10
[52] U.S. Cl. ................................. 333/191; 310/313; 333/194
[58] Field of Search ................. 333/30 R, 72, 71; 310/313; 330/5.5; 331/107 A; 29/25.35, 594

[56] References Cited

U.S. PATENT DOCUMENTS

| 3,699,364 | 10/1972 | Gerard | 330/5.5 X |
| 3,983,515 | 9/1976 | Mitchell et al. | 333/30 R |
| 4,007,433 | 2/1977 | Houkawa et al. | 333/72 |
| 4,023,124 | 5/1977 | Parker et al. | 333/72 |

Primary Examiner—Alfred E. Smith
Assistant Examiner—Marvin Nussbaum
Attorney, Agent, or Firm—Fleit & Jacobson

[57] ABSTRACT

A surface acoustic wave filter for television or other video apparatus comprising a plurality of transducers, wherein at least one weighted transducer includes a pattern of interleaved metal fingers formed on a surface of a piezo-electric substrate, the filter including means for reducing spurious peak signals originating from within the transducer.

5 Claims, 7 Drawing Figures

SURFACE ACOUSTIC WAVE FILTERS

This invention relates to surface acoustic wave filters and in particular to surface acoustic wave filters for use in television and video applications.

Previously a common defect in surface acoustic wave filters has been the presence of spurious peaks in the impulse response. The time positions of these peaks indicate that they may originate from spurious surface acoustic wave sources situated near the ends of a weighted (or apodized) transducer. The effects of these spurious peaks is to produce in television and video applications a ghost image in addition to a ripple in the frequency response.

It is an object of the invention to at least substantially reduce the spurious sources and/or their effects.

According to the invention there is provided a surface acoustic wave filter comprising a plurality of transducers, wherein at least one weighted transducer includes a pattern of interleaved metal fingers formed on a surface of a piezo-electric substrate, and means for reducing spurious peak signals originating from within the transducer.

According to a feature of the invention a surface acoustic wave filter is provided which includes a weighted transducer which has associated therewith a balancing network for varying the centre of balance of the spurious peak signals produced within the transducer such that a substantial reduction of these spurious peak signals is achieved.

According to another feature of the invention a surface acoustic wave filter is provided which includes a weighted transducer wherein the connecting pads to which the pattern of interleaved metal fingers are attached are contoured in a manner whereby the inactive length of at least the end fingers of the pattern are substantially reduced.

According to a further feature of the invention a surface acoustic wave filter is provided which includes a weighted transducer wherein at least one of the end fingers of the pattern of interleaved fingers is tilted by a displacement in relation to the majority of the other fingers of the pattern such that spurious peak signals originating from within the transducers are substantially reduced.

Preferably at least one uniform transducer is associated with each weighted transducer.

Preferably the piezoelectric substrate is a single crystal of lithium niobate or quartz.

Preferably in a weighted transducer according to the invention a pair of end fingers of opposite polarity are tilted by a displacement in relation to the majority of the other fingers forming the pattern on the substrate.

Preferably a weighted transducer according to the invention is adapted to reduce the effects of spurious sources by either contouring the connecting pads or tilting at least one of the end fingers.

However a weighted transducer may be constructed which combines contoured connecting pads with tilted end fingers.

Figure 2:
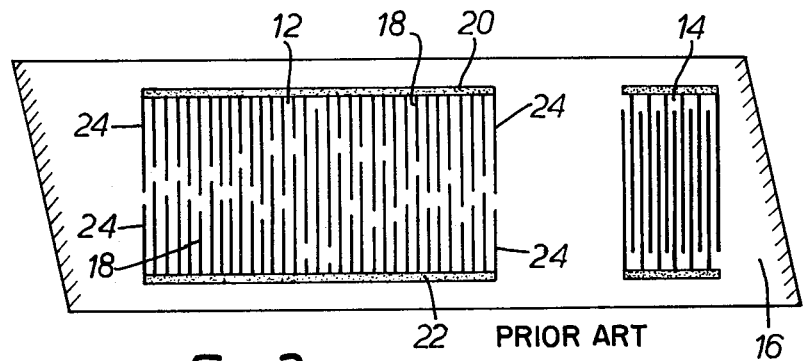
Figure 3A:
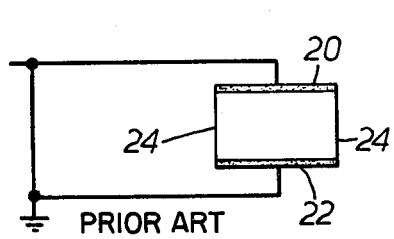
Figure 3B:
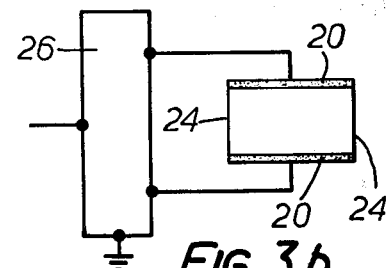
Figure 4:
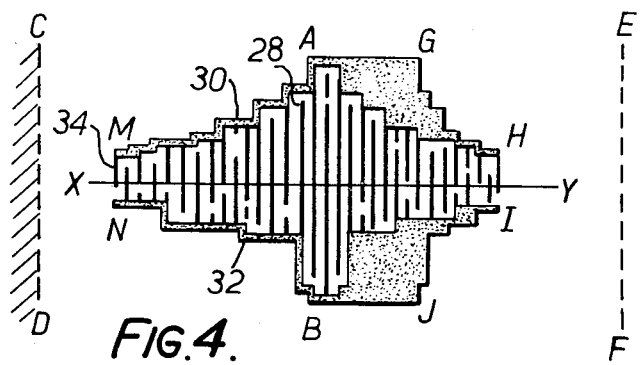
Figure 5:
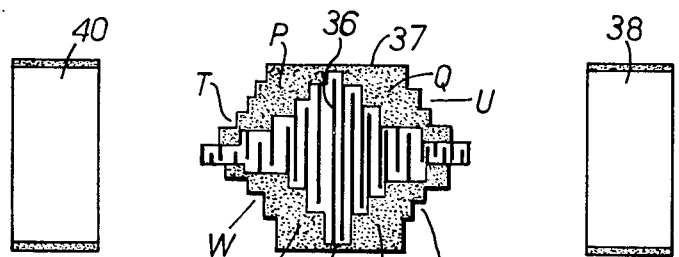
Figure 6:
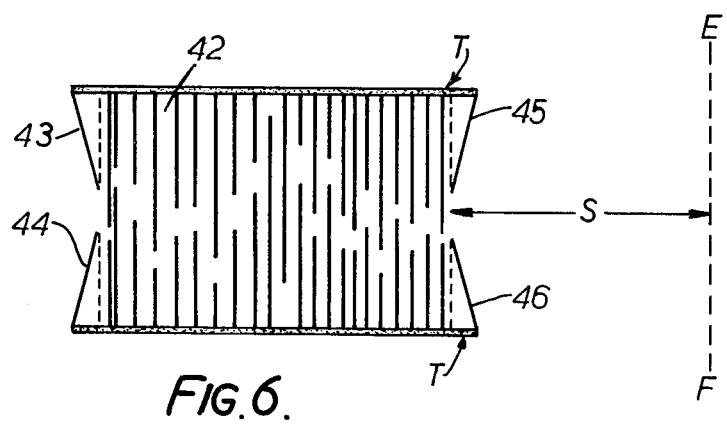

Embodiments of the invention will now be described by way of example only and with reference to the accompanying drawings in which:

FIG. 1 depicts an impulse response characteristic of a prior art surface acoustic wave filter, FIG. 2 diagrammatically illustrates a prior art arrangement of a surface acoustic wave filter comprising a weighted transducer and a uniform transducer, FIG. 3a shows a circuit diagram of a prior art surface acoustic wave filter arrangement, FIG. 3b diagrammatically illustrates a balancing network associated with a weighted transducer according to the invention, FIG. 4 diagrammatically illustrates a surface acoustic wave filter according to the invention FIG. 5 diagrammatically illustrates a further surface acoustic wave filter according to the invention and FIG. 6 diagrammatically illustrates another surface acoustic wave filter according to the invention.

In FIG. 1 there is shown the impulse response characteristic of a known surface acoustic wave filter. On the wave pattern of the impulse response there can be seen a number of spurious peaks 10 which result from spurious sources present in a weighted (or apodized) transducer. As previously mentioned in television/video fields these spurious peaks result in ghost images.

In FIG. 2 there is shown in simplified form a surface acoustic wave filter which comprises a weighted transducer 12 and a uniform transducer 14, which are both formed on a piezo-electric substrate 16. The weighted transducer 12 comprises a pattern of interleaved metal fingers 18 which are joined to connecting pads 20 and 22 of opposite polarity. The overlap between the fingers 18 of opposite polarity are surface acoustic wave sources with amplitudes proportional to the overlaps. The overlaps in the weighted transducer (12) are large in the centre and occupy the whole transducer width. However, at the ends (24) the intended source amplitudes are usually small, and the overlaps are small. It, therefore, follows that there are long supposedly inactive fingers at the ends of the transducer. The spurious sources which produce the spurious peaks (10) originate it is believed at the edges of the supposedly inactive end fingers 24. The present invention provides devices in which the effects of these spurious sources are reduced.

As can be seen in FIG. 2 there are two approximately equal length end fingers (24) at each end of the weighted transducer (12). Previously as shown in FIG. 3a if the feed is unbalanced i.e. if one end is earthy, capacitance to earth causes the spurious signals from the two end fingers 24, at either end of the transducer to have different amplitudes, so that there is, in practice, a net spurious source.

In order to reduce the significance of the effects of the spurious sources a balancing network 26 according to the invention and as shown in FIG. 3b is used. The balancing network 26 produces a balanced feed such that as the two spurious signals are in antiphase i.e. they partially cancel. By adjusting the centre of balance in the balancing network 26 the cancellation can be made exact. However, it is not always possible to use balancing networks as in some applications this addition to the filter would be costly, and in some cases detremental. Thus according to the invention other more fundamental ways of reducing the spurious sources are used.

In FIG. 4 there is shown a weighted transducer 28 according to the invention in which the connecting pads 20 and 22 of FIG. 2 have been altered by contouring the connecting pads 30 and 32 such that the length of the inactive end fingers 34 is substantially reduced, also due to the contouring the lengths of other inactive portions of the transducer have been reduced. The contouring of the connecting pads 30 and 32 results in the formation of a number of different material interfaces, for example, along the axis represented by XY the surface acoustic wave travels along a half metal substrate interface, where the substrate is for example a single crystal of lithium niobate, whereas in the areas AG and BJ there is a predominance of metal, and in the area GH and JI there is a predominance of crystal. These different interfaces are important as they affect the velocity at which a surface acoustic wave travels, for example the velocity of a surface acoustic wave is decreased by passing through metal and increased by passing through crystal.

As the velocity of a surface acoustic wave is effected by travelling through metal or other material, a time delay will be generated in a wave front passing through a variety of different material interfaces, for example, there will be a frequency dependant phase variation across an absorber which is represented by the line CD. This absorber receives a wavefront generated from the line AB. This frequency dependant phase variation is insignificant when the non uniform i.e. incoherent wave fronts are received by an absorber, however, they are very significant when received by a uniform transducer represented by the line EF, as in order to produce an output, the wavefront received by the uniform transducer has to be coherent i.e. a plane wave front. The creation of a plane wavefront is achieved by varying the velocity of the outer portions of the surface acoustic waves such that a plane wave front is received by EF, which corresponds to an output where the spurious peaks have been substantially reduced because their velocity is such that they are incoherent in relation to the majority of wave fronts. From the line MN to the line AB the velocity of the surface acoustic waves is decreased by travelling through a continuous expanse of metal which comprises the portions AG and BJ of the connecting pads 30 and 32. The velocity of the wavefronts is then increased by travelling across the surface of the piezo electric substrate, for example, a single lithium niobate crystal, between GH and JI such that a plane wave front is received at EF. It should be noted that the distances GH and JI are substantially equal (to within 2%) of the distances between AG and BJ this being necessary in order to decrease and increase the velocity of the wave fronts to the desired extent. Thus by variation of the velocity of the surface acoustic waves by contouring the connecting pads, the presence of spurious peaks, in the impulse response is substantially reduced.

With reference to FIG. 5 of the drawings there is illustrated a weighted transducer 36 interposed between two uniform transducers 38 and 40. The connecting pads 37 and 39 of the weighted transducer have been contoured such that the length of the inactive end fingers is reduced. The contouring of the connecting pads 37 and 39 has been done in such a way that regions PQR and S which are predominantly metal and regions TUV and W which are predominantly substrate are formed. This is necessary in order to produce coherent surface acoustic waves for reception by both the uniform transducers 38 and 40. The variation in velocity is similar to that described hereinbefore in connection with FIG. 4.

FIG. 6 illustrates a weighted T of 42 according to the invention, whose end fingers 43, 44, 45 and 46 have been tilted by a displacement T of the outer ends (A tilt the other way would be equally effective but is less convenient). Although all of the end fingers 43, 44, 45 and 46 have been shown as tilted in order to create the desired effect only one end finger for example 45 need be tilted. The tilting of at least one of the end fingers achieves incoherence in those waves created by the spurious sources such that they are not received by the uniform transducer EF. The effect of tilting can be best understood by reference to the following mathematical explanation in which the resulting signal amplitude at EF has a net strength.

$$A(T) = A(O) \frac{\sin x}{x \cos} (wt - X + x)$$

where $x = fT/v$
$x = fS/v$
$f = 2w =$ measuring frequency
$v =$ substrate surface wave velocity
and T and S are the distances shown in FIG. 6. A(O) is the amplitude when $T = O$.

The important term is the amplitude $\sin x/x$ which has progressively smaller maxima at $T = C$, $3v/2f$, $5v/2f$, ... and zeros at $T = v/f$, $2v/f$, $3v/f$, ... We want a small amplitude over the bandwidth $f_o \pm df$. Worst case values of $A(T)/A(O)$ over $f = f_o \pm df$ are shown in the following Table as dependent on $df/f_o$ and T. We see that $T = v/f_o$ is suitable for a narrow band filter, but that $T = 2v/f_o$ or $3v/f_o$ is better if the bandwidth is wide. Larger T takes up more space, which is disadvantageous, so that in most cases $T = 2v/f_o$ or $3v/f_o$ will be optimum. Worst case $A(T)/A(O)$ as dependent on $df/f_o$ and T

| $\frac{df}{f_o} =$ | 0.1 | 0.2 | 0.3 | 0.4 | 0.5. |
|---|---|---|---|---|---|
| $T = \frac{v}{f_o}$ | .13 | .23 | .35 | .5 | — |
| $T = \frac{2v}{f_o}$ | .05 | .09 | .17 | .21 | .23 |
| $T = \frac{3v}{f_o}$ | .04 | .07 | .10 | .12 | .13 |

In FIG. 6 the tilting of the end fingers 43, 44, 45 and 46 is shown as constant, however, the end fingers may be tilted in a non uniform manner along their length, for example a zig zag may be formed. However, the width of the end fingers must remain constant.

The contouring of the connecting pads and the tilting of the end fingers has been shown as rectilinear throughout, however, this is due to the particular pattern generator used and it should be understood that a curved pattern could be used.

Also it should be noted that although the contouring of the connecting pads and the tilting of the end fingers have been described with reference to separate transducers they could be combined together, for example, tilted end fingers at one end with contoured connecting pads at the other. Also the contoured connecting pads could be tilted by displacing the step edges.

What is claimed is:

1. A surface acoustic wave filter comprising a plurality of transducers, including at least one weighted transducer having a pattern of interleaved metal fingers formed on a surface of a piezo electric substrate, at least one uniform transducer associated with said one weighted transducer and means for reducing spurious peak signals originating from within the weighted transducer comprising a balancing network associated with said transducers for varying the center of balance of spurious peak signals produced within the weighted transducer such that a substantial reduction of these spurious peak signals is achieved.

2. A surface acoustic wave filter comprising a plurality of transducers, including at least one weighted transducer having a pattern of interleaved metal fingers formed on a surface of a piezo electric substrate, at least one uniform transducer associated with said one weighted transducer and means for reducing spurious peak signals originating from within the weighted transducer, wherein said at least one weighted transducer includes connecting pads to which the pattern of interleaved metal fingers are attached, said connecting pads contoured in a manner whereby the inactive length of at least the end fingers of the pattern of metal fingers are substantially reduced and wherein the widths of the connecting pads are substantially increased along a portion thereof to decrease the velocity of the acoustic wave passing therethrough.

3. A surface acoustic wave filter as claimed in claim 2 wherein the contoured connecting pads to which the interleaved metal fingers are attached, are tilted in such a way that the spurious peak signals are substantially reduced.

4. A surface acoustic wave filter comprising a plurality of transducers, including at least one weighted transducer having a pattern of interleaved metal fingers formed on a surface of a piezo electric substrate, at least one uniform transducer associated with said one weighted transducer and means for reducing spurious peak signals originating from within the weighted transducer, wherein at least one of the end fingers of said pattern of interleaved metal fingers is tilted by a displacement in relation to the majority of the other fingers of the pattern such that spurious peak signals originating from within the transducer are substantially reduced.

5. A surface acoustic wave filter comprising a plurality of transducers, including at least one weighted transducer having a pattern of interleaved metal fingers formed on a surface of a piezo electric substrate, at least one uniform transducer associated with said one weighted transducer and means for reducing spurious peak signals originating from within the weighted transducer, wherein said at least one weighted transducer includes a pair of tilted end fingers which are associated with the pattern of interleaved metal fingers, said metal fingers being attached to connecting pads which have been contoured such that at least the inactive length of the other end fingers has been substantially reduced.

* * * * *